United States Patent
Li et al.

(10) Patent No.: US 12,396,258 B2
(45) Date of Patent: Aug. 19, 2025

(54) ARRAY SUBSTRATE AND MANUFACTURING METHOD THEREOF

(71) Applicants: HUIZHOU CHINA STAR OPTOELECTRONICS DISPLAY CO., LTD., Guangdong (CN); Shenzhen China Star Optoelectronics Semiconductor Display Technology Co., Ltd., Guangdong (CN)

(72) Inventors: Gongtan Li, Huizhou (CN); Shan Li, Huizhou (CN); Hyunsik Seo, Huizhou (CN)

(73) Assignees: HUIZHOU CHINA STAR OPTOELECTRONICS DISPLAY CO., LTD., Guangdong (CN); SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/608,755

(22) PCT Filed: Aug. 10, 2021

(86) PCT No.: PCT/CN2021/111831
§ 371 (c)(1),
(2) Date: Nov. 3, 2021

(87) PCT Pub. No.: WO2023/000409
PCT Pub. Date: Jan. 26, 2023

(65) Prior Publication Data
US 2024/0038786 A1    Feb. 1, 2024

(30) Foreign Application Priority Data
Jul. 23, 2021  (CN) .......................... 202110836299.4

(51) Int. Cl.
*H10D 30/67*    (2025.01)
*H10D 64/62*    (2025.01)
(Continued)

(52) U.S. Cl.
CPC ..... *H10D 86/0221* (2025.01); *H10D 30/6734* (2025.01); *H10D 30/6755* (2025.01);
(Continued)

(58) Field of Classification Search
CPC ............... H01L 29/7869; H01L 27/127; H01L 27/1248; H01L 29/78648; H10D 30/6732;
(Continued)

(56) References Cited

U.S. PATENT DOCUMENTS 6,147,409 A * 11/2000 Hsia ................ H01L 21/76838
257/E21.582
2013/0207103 A1    8/2013 Lee
(Continued)

FOREIGN PATENT DOCUMENTS

CN    102629628 A    8/2012
CN    102646699 A    8/2012
(Continued)

OTHER PUBLICATIONS

International Search Report in International application No. PCT/CN2021/111831, mailed on Apr. 19, 2022.
(Continued)

*Primary Examiner* — Moazzam Hossain
(74) *Attorney, Agent, or Firm* — PV IP PC; Wei Te Chung

(57) ABSTRACT

An array substrate and a manufacturing method thereof are provided. A metal film layer is formed on an active layer of the array substrate. The metal film layer protects the active layer from being damaged by an etchant liquid or dry etching process during patterning processing of a source
(Continued)

electrode/a drain electrode. Afterwards, a portion of the metal film layer that corresponds to a channel of the active layer the channel is subjected to oxidizing processing to form an oxide layer to help keep the functional property of the active layer. In the entire manufacturing process of the array substrate, the active layer will not be subject to damage in subsequent processing and stability of the device can be maintained.

7 Claims, 4 Drawing Sheets

(51) Int. Cl.
    *H10D 86/01*         (2025.01)
    *H10D 86/40*         (2025.01)
    *H10D 86/60*         (2025.01)

(52) U.S. Cl.
    CPC ........... *H10D 64/62* (2025.01); *H10D 86/423* (2025.01); *H10D 86/451* (2025.01); *H10D 86/60* (2025.01)

(58) Field of Classification Search
    CPC ... H10D 30/673–6734; H10D 86/0221; H10D 30/6734; H10D 30/6755; H10D 64/62; H10D 86/423; H10D 86/451; H10D 86/60; H10D 10/821; H10D 12/032; H10D 30/6757; H10D 86/021; A01G 13/20; H10F 30/222

See application file for complete search history.

(56) References Cited

U.S. PATENT DOCUMENTS

| | | | |
|---|---|---|---|
| 2015/0200212 A1* | 7/2015 | Xun | ..................... H10D 86/441 257/43 |
| 2016/0365368 A1* | 12/2016 | Kano | ................ H01L 29/66742 |
| 2019/0097058 A1* | 3/2019 | Liu | ..................... H01L 27/1225 |
| 2021/0367077 A1* | 11/2021 | Wu | ......................... H01L 29/45 |

FOREIGN PATENT DOCUMENTS

| | | |
|---|---|---|
| CN | 104576760 A | 4/2015 |
| CN | 105140131 A | 12/2015 |
| CN | 105514127 A | 4/2016 |
| CN | 107658345 A | 2/2018 |

OTHER PUBLICATIONS

Written Opinion of the International Search Authority in International application No. PCT/CN2021/111831, mailed on Apr. 19, 2022.

Chinese Office Action issued in corresponding Chinese Patent Application No. 202110836299.4 dated Jan. 27, 2024, pp. 1-7.

\* cited by examiner

ARRAY SUBSTRATE AND MANUFACTURING METHOD THEREOF

FIELD OF INVENTION

The present invention relates to display technologies, and more particularly, to an array substrate and a manufacturing method thereof.

BACKGROUND OF INVENTION

Oxide thin-film transistor (Indium Gallium Zinc Oxide, IGZO) technology has been considered a substitute of the amorphous silicon thin-film transistor technology as a main stream technique for the next-generation display-driving backplanes. Compared with the amorphous silicon thin-film transistor technology, the oxide thin-film transistor technology features high mobility ($\mu$>10 cm2/Vs), good large-area homogeneity, and low production cost.

Technical problem: since the oxide thin-film transistors, particularly oxide thin-film transistors adopting a back channel etch (BCE) structure, suffer certain problems in respect of stability, in the manufacturing process of a known BCE structured based oxide thin-film transistor, an oxide channel portion that is exposed is directly subjected to influences caused by an etchant liquid for source/drain metals or a dry etching process, and this leads to poor stability of the device. To prevent the oxide channel from being damaged, a conventional etch stop structure based oxide thin-film transistor includes an SiOx insulation film layer to block the damage, yet this adds one more SiOx film forming process and one more mask, and thus increases operation steps and cost.

Thus, it is a technical issue to be immediately resolved to improve the stability of an oxide thin-film transistor, especially improving the stability of a BCE structure based oxide thin-film transistor.

SUMMARY OF INVENTION

Embodiments of the disclosure provide an array substrate and a manufacturing method thereof, for resolving the technical issues that in a manufacturing process, an oxide channel of a known back-channel-etch type oxide thin-film transistor is exposed and may be wrongly etched easily and get damaged in subsequent operations, so as to cause lowering of the stability of the device.

To resolve the above technical issues, the present invention provides an array substrate, which comprises:
  a base;
  a primary gate electrode, which is located on the base;
  an active layer, which is located on the primary gate electrode;
  an etch stop layer, which is located on the active layer; and
  a source electrode and a drain electrode, which are located on the etch stop layer;
  wherein the source electrode and the drain electrode partly cover the etch stop layer, and an area of the etch stop layer is not covered by the source electrode and the drain electrode and is arranged as an oxidized metal layer, the oxidized metal layer being arranged to correspond, in position, to the active layer and the primary gate electrode.

According to an embodiment of the present invention, the source electrode and the drain electrode are both provided with a metal connection layer arranged thereon, and the drain electrode is connected through the metal connection layer to a pixel.

According to an embodiment of the present invention, a material of the metal connection layer comprises any one of Mo, MoTi, and MoNi.

According to an embodiment of the present invention, the base is further provided with a passivation layer arranged thereon, and the passivation layer at least covers the oxidized metal layer and the metal connection layer located on the source electrode and the drain electrode; and
  the passivation layer is formed with a through hole, and the through hole corresponds, in position, to the metal connection layer located on the drain electrode.

According to an embodiment of the present invention, the passivation layer comprises a first sub-passivation layer and a second sub-passivation layer that are arranged to stack on each other, the first sub-passivation layer being partly in contact with the oxidized metal layer, a material of the first sub-passivation layer comprising silicon oxides.

According to an embodiment of the present invention, the oxide thin-film transistor further comprises a secondary gate electrode, the secondary gate electrode being located above the oxidized metal layer and corresponding, in position, to the oxidized metal layer; and the secondary gate electrode is arranged between the first sub-passivation layer and the second sub-passivation layer.

According to an embodiment of the present invention, a material of the etch stop layer comprises Ti, and a film thickness of the etch stop layer is 5 nm to 10 nm.

According to an embodiment of the present invention, a thickness of a layer in which the source electrode and the drain electrode are located is 3 to 5 times of a film thickness of the etch stop layer or the metal connection layer.

According to the array substrate provided in the present invention, a manufacturing method for the array substrate is further provided, the method comprising the following steps:
  S10: providing a base, and forming a primary gate electrode, a gate insulation layer, and an active layer on the base;
  S20: forming a combined metal layer on the active layer, wherein the combined metal layer comprises an etch stop layer, a source-drain metal layer, and a metal connection layer that are arranged to stack on each other;
  S30: subjecting metal layers of the combined metal layer that are other than the etch stop layer to patterning processing to form a source electrode and a drain electrode located on the etch stop layer and the metal connection layer located on the source electrode and the drain electrode;
  S40: subjecting a zone of the etch stop layer that is not covered by the source electrode and the drain electrode to oxidizing processing to form an oxidized metal layer, wherein the oxidized metal layer and the active layer are arranged to correspond, in position, to each other; and
  S50: forming a passivation layer on a film layer formed in Step S40.

According to an embodiment of the present invention, Step S30 comprises:
  subjecting the metal connection layer and the source-drain metal layer to the patterning processing with wet etching to form the source electrode and the drain electrode and the metal connection layer on the source electrode and the drain electrode.

According to an embodiment of the present invention, a material of the metal connection layer comprises any one of Mo, MoTi, and MoNi.

According to an embodiment of the present invention, a material of the etch stop layer comprises Ti; and "subjecting a zone of the etch stop layer that is not covered by the source electrode and the drain electrode to oxidizing processing" of Step S40 comprises:

applying O2 plasma to subject the etch stop layer to oxidizing process, wherein a zone of the etch stop layer that is subjected to the oxidizing processing reacts and forms a TiO oxide metal layer.

According to an embodiment of the present invention, a film thickness of the etch stop layer is 5 nm to 10 nm.

According to an embodiment of the present invention, a thickness of a layer in which the source electrode and the drain electrode are located is 3 to 5 times of a film thickness of the etch stop layer or the metal connection layer.

According to an embodiment of the present invention, Step S50 comprises:

S501: forming a first sub-passivation layer on a film layer formed in Step S40;

S502: forming a secondary gate electrode on the first sub-passivation layer, wherein the secondary gate electrode and the oxidized metal layer are arranged to correspond, in position, to each other; and S503: forming a second sub-passivation layer on the first sub-passivation layer, wherein the second sub-passivation layer covers the secondary gate electrode.

According to an embodiment of the present invention, Step S50 further comprises:

S504: forming through holes in the first sub-passivation layer and the second sub-passivation layer to be in communication with each other, wherein the through holes correspond, in position, to the metal connection layer on the source electrode or the metal connection layer on the drain electrode.

According to an embodiment of the present invention, a material of the first sub-passivation layer comprises silicon oxides.

The beneficial effect of the present disclosure is that: compared to the prior art, the array substrate and the manufacturing thereof provided in the present invention are such that a metal film layer is formed on an active layer of an oxide thin-film transistor, and the metal film layer protects the active layer from being damaged by an etchant liquid or dry etching processing in subsequent patterning processing of source/drain electrodes, and afterwards, a portion of the metal film layer that corresponds to a channel of the active layer is subjected to oxidization processing to form an oxide layer to help keep the functional property of the active layer; and in the entire manufacturing process of the array substrate, the active layer will not be subject to damage in subsequent processing and stability of the device can be maintained.

DESCRIPTION OF DRAWINGS

To describe the embodiments or the technical solutions of the prior art more clearly, the following provides a brief description of drawings that are necessary for the description of the embodiments or the prior art. Obviously, the drawings as described below disclose only some embodiments, and for those having ordinary skill in the field, other drawings may be contemplated according to the attached drawings without making creative endeavor.

DETAILED DESCRIPTION OF PREFERRED EMBODIMENTS

Figure 1:
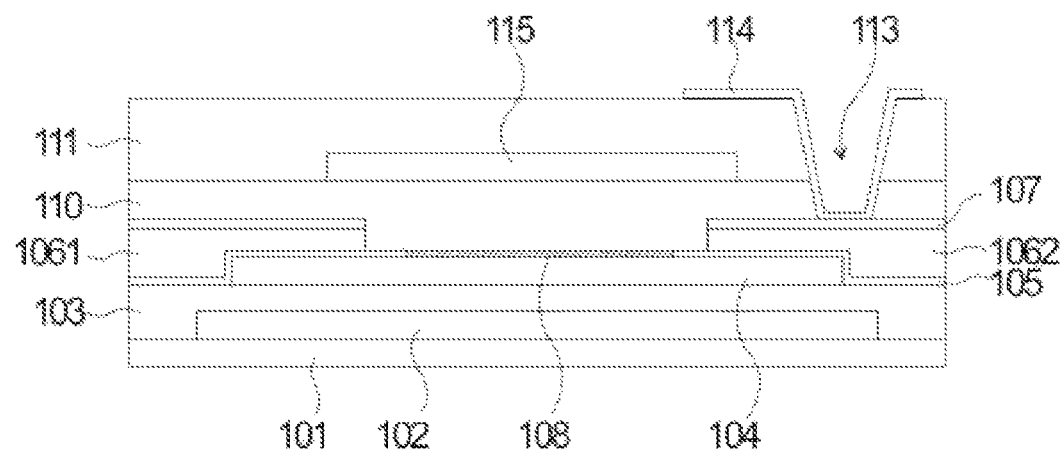
FIG. 1 is a schematic structural diagram of an array substrate provided in the present invention.

The description of the embodiments provided below make reference to the attached drawings to provide an example illustration of specific embodiments in which the disclosure may be implemented. Direction related terms as used herein, such as "up", "down", "front", "rear", "left", "right", "inside", "outside", and "lateral side", indicate directions referring to the attached drawings. Thus, using the direction related terms is for illustration and understanding of the disclosure, and is not intended to limit the disclosure. In the drawings, units having similar structures are designated with the same reference numerals.

A further description of the disclosure will be provided below with reference to the attached drawings and embodiments.

An embodiment of the disclosure provides an array substrate, and a detailed description will be provided below with reference to FIG. 1.

Referring to FIG. 1, FIG. 1 is a schematic structural diagram of an array substrate provided in an embodiment of the disclosure. The array substrate provided in the present invention comprises the base 101. A primary gate electrode 102 is formed on the base 101. The primary gate electrode 102 is covered with a gate insulation layer 103. An active layer 104 is formed on the gate insulation layer 103, and the active layer 104 and the primary gate electrode 102 correspond in position to each other. A first layer of metal is formed on the active layer 104 and the gate insulation layer 103 to serve as an etch stop layer 105 of the active layer 104. A second layer of metal is formed on the etch stop layer 105 to serve as a source electrode 1061 and a drain electrode 1062. A third layer of metal is formed on both the source electrode 1061 and the drain electrode 1062 to serve as a metal connection layer 107 connecting the drain electrode 1062 to a pixel. A passivation layer is formed on the film stack structure that is formed as above in order to form an oxide thin-film transistor of the array substrate provided in the present invention.

The etch stop layer 105 is arranged to cove the active layer 104. The etch stop layer 105 comprises an oxidized metal area corresponding to a middle portion of the active layer 104 and non-oxidized areas oppositely arranged at two ends of the oxidized metal area. The metal oxide area of the etch stop layer 105 can be arranged as an oxidized metal layer and also functions as a channel 108 of the active layer 104. The source electrode 1061 and the drain electrode 1062 partly cover the etch stop layer 105. Parts of the etch stop layer 105 that are covered by the source electrode 1061 and the drain electrode 1062 are the non-oxidized areas of the etch stop layer 105. A part of the etch stop layer 105 that is not covered by the source electrode 1061 and the drain electrode 1062 is the oxidized metal area of the etch stop layer 105.

The source electrode 1061 and the drain electrode 1062 respectively lap over two ends of the active layer 104 by means of the non-oxidized areas of the etch stop layer 105. The source electrode 1061 and the drain electrode 1062 are spaced from each other and are arranged to avoid the oxidized metal area. Further, the source electrode 1061 and the drain electrode 1062 are each a non-planar structure and the two are arranged symmetric with respect to the active layer 104. In the following, the source electrode 1061 is taken as an example for illustration. The source electrode 1061 comprises a first-dimension metal layer (which is a metal layer arranged horizontally) and a second-dimension metal layer (which is a metal layer arranged vertically). The first-dimension metal layer and the second-dimension metal layer are arranged to connect at an intersection thereof, wherein the first-dimension metal layer is arranged on the active layer 104 and is in electrical contact engagement with the active layer 104 by means of the etch stop layer 105 and a terminal portion of the first-dimension metal layer terminates at a border of the oxidized metal area; and the second-dimension metal layer is arranged on the gate insulation layer 103 and a side surface of the second-dimension metal layer is in electrical contact engagement with an end surface of the active layer 104 by means of the etch stop layer 105. The drain electrode 1062 has a structure that is arranged symmetric to the source electrode, and repeated description will be omitted herein.

The array substrate comprises at least one passivation layer. A surface of the passivation layer will receive a pixel electrode of a display panel to dispose thereon in a subsequent process. A through hole is formed in the passivation layer, and the through hole and the drain electrode 1062 correspond, in position, to each other. The pixel electrode is extended into the through hole and is in electrical contact engagement with the metal connection layer 107 on the source electrode 1061 or the drain electrode 1062.

For example, the array substrate comprises two passivation layers, namely a first sub-passivation layer 110 and a second sub-passivation layer 111 located on the first sub-passivation layer 110. The first sub-passivation layer 110 and the second sub-passivation layer 111 are arranged to stack on each other. The first sub-passivation layer 110 and the second sub-passivation layer 111 are formed with through holes 113 that are in alignment with each other. The pixel electrode 114 is formed on a surface of the second sub-passivation layer 111 and the pixel electrode 114 is extended into the through holes 113 and is in electrical contact engagement with the metal connection layer 107 on the source electrode 1061 or the drain electrode 1062.

In addition, the array substrate further comprises a secondary gate electrode 115. The secondary gate electrode 115 is arranged to align with the oxidized metal area of the active layer 104. In a thickness direction of the array substrate, the secondary gate electrode 115 and the primary gate electrode 102 are located on two opposite sides of the active layer 104, and the secondary gate electrode 115 is located between the first sub-passivation layer 110 and the second sub-passivation layer 111. For example, the secondary gate electrode 115 is located on a surface of the first sub-passivation layer 110. Alternatively, the secondary gate electrode 115 is formed in the first sub-passivation layer 110, and a surface of the secondary gate electrode 115 is arranged flush with a surface of the first sub-passivation layer 110. The dual-gate structure functions to enhance the stability of the oxide thin-film transistor.

Further, the first sub-passivation layer 110 and the second sub-passivation layer 111 are made of different materials. For example, the first sub-passivation layer 110 is arranged closer to the active layer 104 than the second sub-passivation layer 111, and the first sub-passivation layer 110 covers the metal connection layer 107 on the source electrode 1061 and the drain electrode 1062 and covers the oxidized metal area of the active layer 104, and thus, the first sub-passivation layer 110 is also made of an oxide insulation material to expand electrical induction between the oxidized metal area of the active layer 104 and the secondary gate electrode 115, while the second sub-passivation layer 111 is made of a material that is different from the first sub-passivation layer 110. Preferably, the first sub-passivation layer 110 is made of a SiOx material, and the second sub-passivation layer 111 is made of a SiNx material.

The array substrate provided in the present invention comprises a combined metal layer that includes the etch stop layer 105, the layer in which the source electrode 1061/drain electrode 1062 are located, and the metal connection layer 107, and the etch stop layer 105 covers the gate insulation layer 103 and the active layer 104, and side surfaces of the etch stop layer 105 cover terminal portions of the active layer 104.

Further, the source electrode 1061/drain electrode 1062 located layer is disposed between the etch stop layer 105 and the metal connection layer 107. Film thicknesses of the etch stop layer 105 and the metal connection layer 107 are identical and the film thicknesses of the etch stop layer 105 and the metal connection layer 107 are 5 nm to 10 nm. The film thickness of the source electrode 1061/drain electrode 1062 located layer is 3 to 5 times of the film thickness if the etch stop layer 105 or the metal connection layer 107. Preferably, the film thickness of the source electrode 1061/drain electrode 1062 located layer refers to a total thickness of the first-dimension metal layer and the second-dimension metal layer. The source electrode 1061/drain electrode 1062 located layer adopts a sunk arrangement and laps over one side of the active layer 104. Portions of the source electrode 1061/drain electrode 1062 located layer extending beyond the active layer 104 are less than the total thickness of the source electrode 1061/drain electrode 1062 located layer, and thus, the combined metal layer does not increase an overall thickness of the display panel.

For example, the etch stop layer 105 is made of a material of Ti; the metal connection layer 107 is made of any one material of Mo, MoTi, and MoNi; the source electrode 1061/drain electrode 1062 located layer is made of a material of Cu. Further, the material that makes the etch stop layer 105 is switchable with the metal connection layer 107.

According to the array substrate provided in the present invention, the present invention also provides a manufacturing process for such an array substrate. With reference to FIGS. 2a-2g, FIGS. 2a-2g are schematic structural diagrams showing a flow of manufacturing the array substrate provided in the present invention.

Figure 2A:
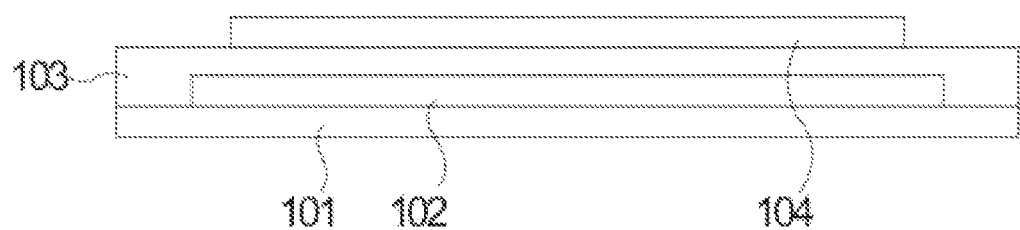
FIGS. 2a-2g are schematic structural diagrams showing a flow of manufacturing an array substrate provided in the present invention.

As shown in FIG. 2a, a base plate is provided. A primary gate electrode 102 is formed on the base plate. A gate insulation layer 103 is formed on the base plate and the primary gate electrode 102. A patterned active layer 104 is formed on the gate insulation layer 103. The active layer 104 is an oxide semiconductor layer.

Figure 2B:
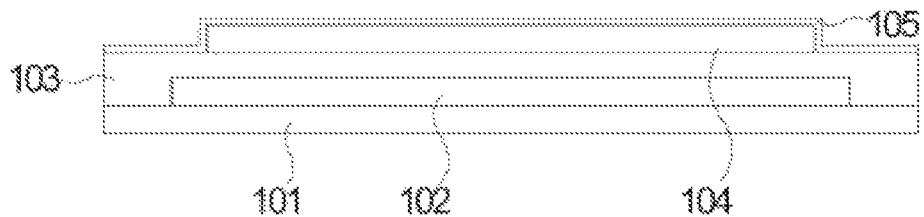

As shown in FIG. 2b, a first metal layer, which is the etch stop layer 105, is arranged on the film structure of FIG. 2a, such that the first metal layer covers a surface and end faces of the active layer 104 and a surface of the gate insulation layer 103. The first metal layer completely covers the active layer 104. A material of the first metal layer is preferably Ti, and a thickness of the first metal layer is 5 nm to 10 nm.

Figure 2C:
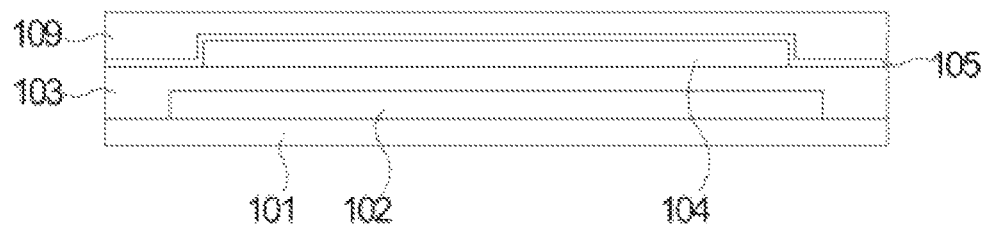

As shown in FIG. 2c, a second metal layer 109, which is the source electrode and drain electrode metal layer, is arranged on the film structure of FIG. 2b, such that the second metal layer 109 is arranged on a surface of the first metal layer. The second metal layer 109 is made of a material that is different from the first metal layer and has a thickness greater than the second metal layer 109. Preferably, the second metal layer 109 is made of a material of Cu, and the thickness of the second metal layer 109 is 3-5 times of the thickness of the first metal layer.

Figure 2D:
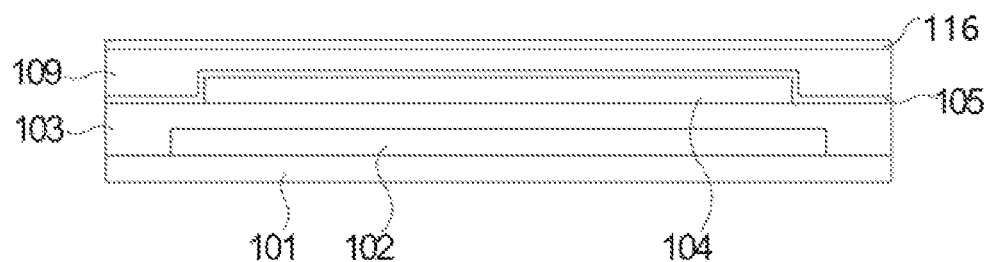

As shown in FIG. 2d, a third metal layer 116 is arranged on the film structure of FIG. 2c, such that the third metal layer 116 is arranged on a surface of the second metal layer 109, and the third metal layer 116 is made of a material that is different from both the second metal layer 109 and the first metal layer. Preferably, the third metal layer 116 is made of any one material of Mo, MoTi, and MoNi, and a thickness of the third metal layer 116 is less than the thickness of the second metal layer 109. The thickness of the third metal layer 116 is identical to the thickness of the first metal layer.

Figure 2E:
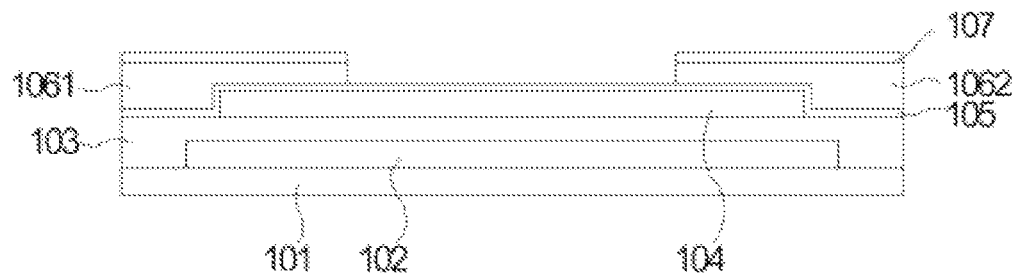

As shown in FIG. 2e, on the film structure of FIG. 2d, patterning processing is implanted on the second metal layer 109 and the third metal layer 116, such that photolithography being applied to etching the second metal layer 109 and the third metal layer 116 to form the source electrode 1061 and the drain electrode 1062 that are opposite to each other and the metal connection layer 107 located on the source electrode 1061 and the drain electrode 1062, where the first metal layer serves as the etch stop layer 105 for the active layer 104 and is preserved in the operation of forming the source electrode 1061 and the drain electrode 1062, and functions to avoid incorrect etching to the active layer 104 during photolithography. An etching region of the second metal layer 109 and the third metal layer 116 corresponds, in position, to the active layer 104, and the source electrode 1061 and the drain electrode 1062 are connected through the first metal layer to the active layer 104.

Figure 2F:
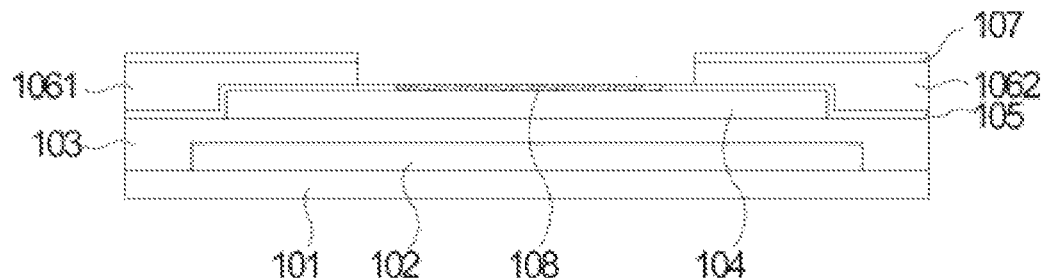

As shown in FIG. 2f, on the film structure of FIG. 2e, O2 plasma processing is implemented on a portion of the first metal layer that is exposed in the etching region to form an oxide metal region to serve as the channel 108 of the active layer 104. To this point, a main structure of the oxide thin-film transistor has been completed, and an ancillary structure of the oxide thin-film transistor will be formed in a subsequent process.

Figure 2G:
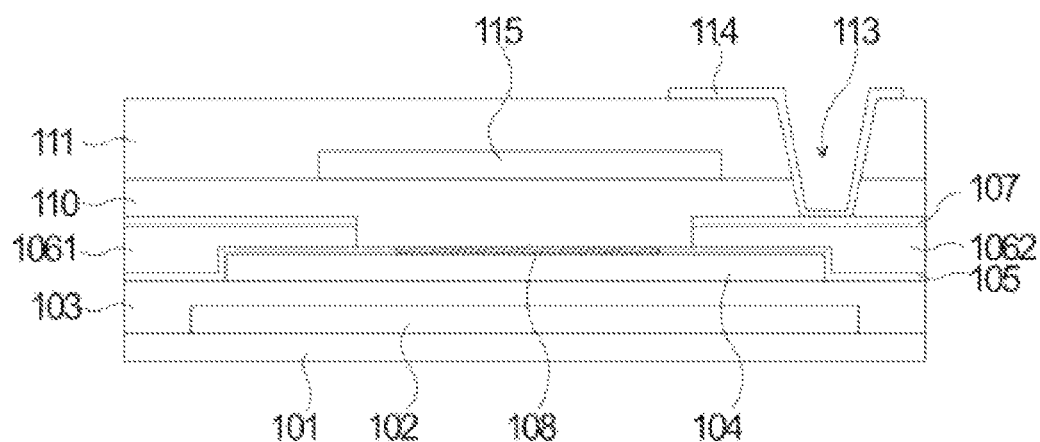

As shown in FIG. 2g, on the film structure of FIG. 2f, a first sub-passivation layer 110 is formed, wherein the first sub-passivation layer 110 is arranged in a laying manner and filling up the etching region of the second metal layer 109 and the third metal layer 116. A secondary gate electrode 115 is formed on the first sub-passivation layer 110. The secondary gate electrode 115 is arranged as being in alignment, in position, with the primary gate electrode 102, and the secondary gate electrode 115 is arranged to be in alignment, in position, with at least the channel 108 of the active layer 104. A second sub-passivation layer 111 is arranged on the first sub-passivation layer 110, and the second sub-passivation layer 111 and the first sub-passivation layer 110 are made of different materials. Further, the first sub-passivation layer 110 is arranged to be relatively close to the oxide metal region of the first metal layer. The first sub-passivation layer 110 adopts an oxide material, for example the first sub-passivation layer 110 being made of a SiOx material. The second sub-passivation layer 111 is made of a SiNx material. Further, the first sub-passivation layer 110 and the second sub-passivation layer 111 are formed with a through hole 113 in a location corresponding to the source electrode 1061 or the drain electrode 1062. The through hole 113 is filled up with a metal layer, and the metal layer has an end connected to the metal connection layer 107 on the source electrode 1061 or the drain electrode 1062 and an opposite end connected to a pixel electrode 114 of a display panel to form a complete oxide thin-film transistor. In forming the through hole 113, the metal connection layer 107 prevents, on one hand, dry etching or etching processing from affecting the source electrode 1061 or the drain electrode 1062 to ensure intactness of the source electrode 1061 and the drain electrode 1062, and the metal connection layer 107 also functions as an ancillary connection layer for the source electrode 1061 and the drain electrode 1062, so as to maintain stability of connecting the source electrode 1061 and the drain electrode 1062 to the pixel electrode 114.

Figure 3:
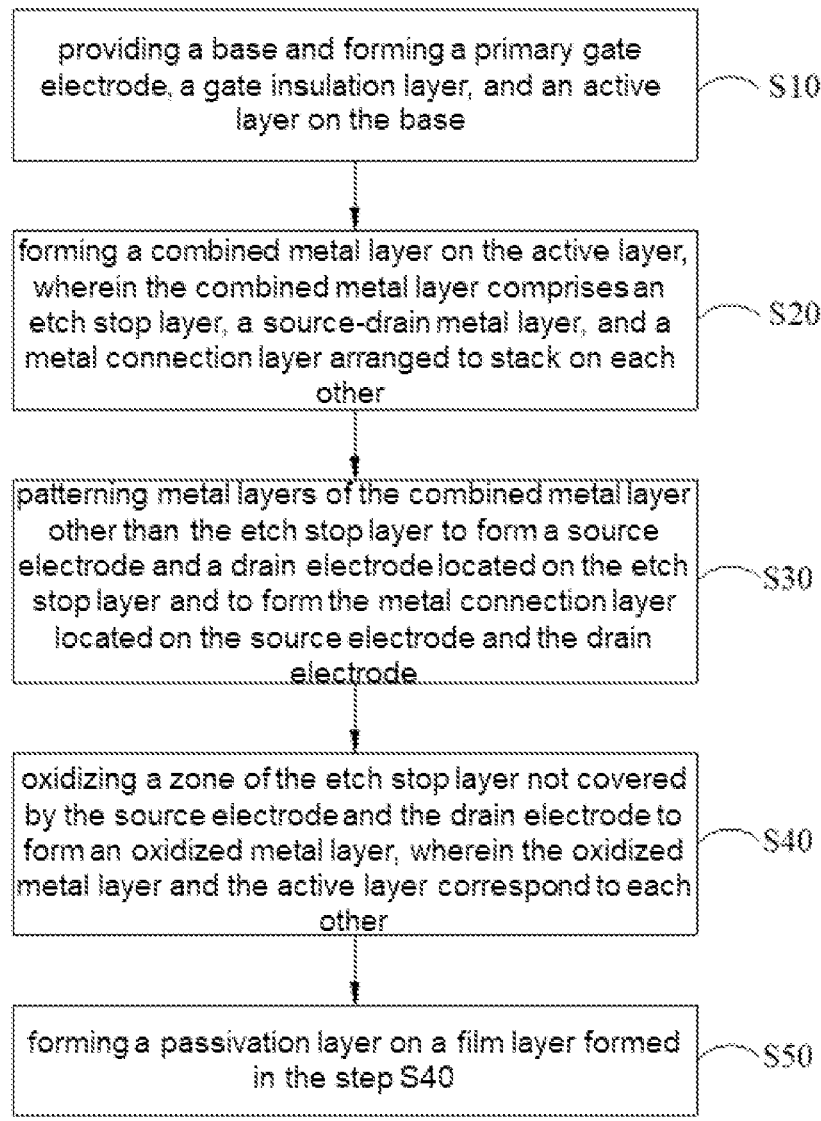
FIG. 3 is a flow chart of manufacturing an array substrate provided in the present invention.

Referring to FIG. 3, FIG. 3 is a flow chart of manufacturing an array substrate provided in the present invention. According to the array substrate provided in the present invention, a manufacturing method for the array substrate is also provided. The method comprises the following steps:

S10: providing a base, and forming a primary gate electrode, a gate insulation layer, and an active layer on the base;

S20: forming a combined metal layer on the active layer, wherein the combined metal layer comprises an etch stop layer, a source-drain metal layer, and a metal connection layer that are arranged to stack on each other;

S30: subjecting metal layers of the combined metal layer that are other than the etch stop layer to patterning processing to form a source electrode and a drain electrode located on the etch stop layer and the metal connection layer located on the source electrode and the drain electrode;

S40: subjecting a zone of the etch stop layer that is not covered by the source electrode and the drain electrode to oxidizing processing to form an oxidized metal layer, wherein the oxidized metal layer and the active layer are arranged to correspond, in position, to each other; and S50: forming a passivation layer on a film layer formed in Step S40.

According to an embodiment of the present invention, Step S30 comprises:

subjecting the metal connection layer and the source-drain metal layer to the patterning processing with wet etching to form the source electrode and the drain electrode and the metal connection layer on the source electrode and the drain electrode.

As shown in FIG. 2e, in Step S30, wet etching is applied to subject the second metal layer 109 and the third metal layer 116 to etching to form the source electrode 1061 and the drain electrode 1062 that are opposite to each other and the metal connection layer 107 that is located on the source electrode 1061 and the drain electrode 1062. The first metal layer serves as the etch stop layer 105 for the active layer 104 and is preserved during forming of the source electrode 1061 and the drain electrode 1062 and functions to prevent incorrect etching of the active layer 104 by photolithography. The etching region of the second metal layer 109 and the third metal layer 116 and the active layer 104 are arranged to correspond in position, and the source electrode 1061 and the drain electrode 1062 are connected by the first metal layer to the active layer 104.

According to an embodiment of the present invention, the etch stop layer is made of a material of Ti. In the operation of "subjecting a zone of the etch stop layer that is not covered by the source electrode and the drain electrode to oxidizing processing" of Step S40, O2 plasma is applied to subject the etch stop layer to oxidizing process, and the zone of the etch stop layer that is subjected to the oxidizing processing reacts and forms a TiO oxide metal layer.

According to an embodiment of the present invention, Step S50 comprises:

S501: forming a first sub-passivation layer on a film layer formed in Step S40;

S502: forming a secondary gate electrode on the first sub-passivation layer, wherein the secondary gate electrode and the oxidized metal layer are arranged to correspond, in position, to each other; and S503: forming a second sub-passivation layer on the first sub-passivation layer, wherein the second sub-passivation layer covers the secondary gate electrode.

According to an embodiment of the present invention, Step S50 further comprises: S504 in which through holes are formed in the first sub-passivation layer and the second sub-passivation layer to be in communication with each other, wherein the through holes correspond, in position, to the metal connection layer on the source electrode or the metal connection layer on the drain electrode.

As shown in FIGS. 2b-2d, in Step S20, the combined metal layer comprises the first metal layer, the second metal layer 109, and the third metal layer 116 that are stacked on each other. The first metal layer serves as the etch stop layer 105. The first metal layer covers a surface and end faces of the active layer 104 and a surface of the gate insulation layer 103. The first metal layer completely covers the active layer 104. A material of the first metal layer is preferably Ti, and a thickness of the first metal layer is 5 nm to 10 nm.

The second metal layer 109 is a metal layer that is subjected to etching to form the source electrode and the drain electrode. The second metal layer 109 is arranged on a surface of the first metal layer. The second metal layer 109 is made of a material different from the first metal layer and has a thickness greater than the second metal layer 109. Preferably, the second metal layer 109 is made of a Cu material, and the thickness of the second metal layer 109 is 3 to 5 times of the thickness of the first metal layer.

The third metal layer 116 serves as the metal connection layer. The third metal layer 116 is arranged on a surface of the second metal layer 109. A material of the third metal layer 116 is different from both the second metal layer 109 and the first metal layer. Preferably, the third metal layer 116 is made of any one material of Mo, MoTi, and MoNi, and a thickness of the third metal layer 116 is far smaller than the thickness of the second metal layer 109. The thickness of the third metal layer 116 is identical to the thickness of the first metal layer.

Compared to the prior art, an embodiment of the present invention provides an array substrate, and a metal film layer is formed on an active layer of the array substrate, such that the metal film layer protects the active layer from being damaged by an etchant liquid or dry etching process during subsequent patterning processing of source/drain electrodes, and afterwards, a portion of the metal film layer that corresponds to a channel of the active layer the channel is subjected to oxidizing processing to form an oxide layer to help keep the functional property of the active layer. In the entire manufacturing process of the array substrate, the active layer will not be subject to damage in subsequent processing and stability of the device can be maintained.

In summary, although the application is disclosed above by means of the preferred embodiments, such preferred embodiments that are described above are not intended to limit the application. Those having ordinary skill in the art may contemplate various alternations and modifications without departing from the sprits and scope of the application, and thus, the scope of protection that the applicant seeks for is based on the scope defined by the claims.

What is claimed is:

1. An array substrate, comprising:
   a base;
   a primary gate electrode located on the base;
   an active layer located on the primary gate electrode;
   an etch stop layer located on the active layer;
   a source electrode and a drain electrode located on the etch stop layer, and
   a metal connection layer arranged on surfaces of the source electrode and the drain electrode away from the base, wherein the drain electrode is connected to a pixel through the metal connection layer;
   wherein the source electrode and the drain electrode partly cover the etch stop layer, an area of the etch stop layer not covered by the source electrode and the drain electrode is configured to be an oxidized metal layer, and the oxidized metal layer corresponds to the active layer and the primary gate electrode;
   wherein a thickness of a portion of the source electrode extending beyond the active layer is less than a total thickness of the source electrode, and a thickness of a portion of the drain electrode extending beyond the active layer is less than a total thickness of the drain electrode.

2. The array substrate according to claim 1, wherein a material of the metal connection layer comprises any one of Mo, MoTi, and MoNi.

3. The array substrate according to claim 1, further comprising a passivation layer arranged on the base, wherein the passivation layer at least covers the oxidized metal layer and the metal connection layer located on the source electrode and the drain electrode; and
   the passivation layer is formed with a through hole, and the through hole corresponds to the metal connection layer located on the drain electrode.

4. The array substrate according to claim 3, wherein the passivation layer comprises a first sub-passivation layer and a second sub-passivation layer arranged to stack on each other, the first sub-passivation layer is partly in contact with the oxidized metal layer, and a material of the first sub-passivation layer comprises silicon oxide.

5. The array substrate according to claim 4, wherein an oxide thin-film transistor further comprises a secondary gate electrode, and the secondary gate electrode is located above the oxidized metal layer and corresponding to the oxidized metal layer; and
   wherein the secondary gate electrode is arranged between the first sub-passivation layer and the second sub-passivation layer.

6. The array substrate according to claim 1, wherein a material of the etch stop layer comprises Ti, and a film thickness of the etch stop layer ranges from 5 nm to 10 nm.

7. The array substrate according to claim 1, wherein a film thickness of a layer the source electrode and the drain electrode are located ranges from 3 to 5 times of a film thickness of the etch stop layer or the metal connection layer.

* * * * *